US010338634B2

(12) United States Patent
Kumagai

(10) Patent No.: US 10,338,634 B2
(45) Date of Patent: Jul. 2, 2019

(54) SEMICONDUCTOR STORAGE DEVICE HAVING A SUPPORT MEMBER FOR A MEMORY CONTROLLER

(71) Applicant: TOSHIBA MEMORY CORPORATION, Tokyo (JP)

(72) Inventor: Kengo Kumagai, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/414,141

(22) Filed: Jan. 24, 2017

(65) Prior Publication Data
US 2017/0220063 A1 Aug. 3, 2017

(30) Foreign Application Priority Data
Jan. 29, 2016 (JP) .................. 2016-015745

(51) Int. Cl.
G06F 1/16 (2006.01)
H01L 23/00 (2006.01)
H05K 1/02 (2006.01)
H05K 1/18 (2006.01)

(52) U.S. Cl.
CPC ............... *G06F 1/16* (2013.01); *H01L 24/17* (2013.01); *H05K 1/0204* (2013.01); *H05K 1/0271* (2013.01); *H05K 1/181* (2013.01); H01L 2924/1436 (2013.01); H01L 2924/1438 (2013.01); H05K 2201/10159 (2013.01); Y02P 70/611 (2015.11)

(58) Field of Classification Search
None
See application file for complete search history.

(56) References Cited

U.S. PATENT DOCUMENTS

| 5,790,382 | A | 8/1998 | Sexton | |
|---|---|---|---|---|
| 7,551,452 | B2 * | 6/2009 | Ishimaru | H05K 1/0271 174/255 |
| 9,769,944 | B2 * | 9/2017 | Mori | H05K 5/0056 |
| 2006/0139902 | A1 * | 6/2006 | Happoya | H05K 1/0271 361/760 |
| 2015/0043178 | A1 * | 2/2015 | Peng | H05K 7/1452 361/752 |

(Continued)

FOREIGN PATENT DOCUMENTS

JP H04206888 A 7/1992
JP H06188554 A 7/1994
(Continued)

Primary Examiner — Binh B Tran
Assistant Examiner — Douglas R Burtner
(74) Attorney, Agent, or Firm — Kim and Stewart LLP

(57) ABSTRACT

A semiconductor storage device includes a substrate having first, second, third, and fourth lateral sides and a connector interface on the first lateral side, a nonvolatile semiconductor memory disposed on a surface of the substrate between the first lateral side and the second lateral side, which is opposite to the first lateral side, a memory controller disposed on a surface of the substrate between the first lateral side and the second lateral side, and a support for the memory controller disposed on a surface of the substrate to support at least one side of the memory controller.

10 Claims, 11 Drawing Sheets

(56) References Cited

U.S. PATENT DOCUMENTS

| | | | | |
|---|---|---|---|---|
| 2015/0348930 | A1* | 12/2015 | Jeong | H01L 24/17 257/737 |
| 2017/0034963 | A1* | 2/2017 | Cho | H05K 9/0026 |
| 2017/0060199 | A1* | 3/2017 | Kim | G06F 1/20 |

FOREIGN PATENT DOCUMENTS

| | | |
|---|---|---|
| JP | 2006186136 A | 7/2006 |
| JP | 4619214 B2 | 1/2011 |

\* cited by examiner

SEMICONDUCTOR STORAGE DEVICE HAVING A SUPPORT MEMBER FOR A MEMORY CONTROLLER

CROSS-REFERENCE TO RELATED APPLICATION

This application is based upon and claims the benefit of priority from Japanese Patent Application No. 2016-015745, filed Jan. 29, 2016, the entire contents of which are incorporated herein by reference.

FIELD

Embodiments described herein relate generally to semiconductor storage devices.

BACKGROUND

In an electronic device having a semiconductor storage device therein, electronic parts are mounted on a substrate. For example, when an impact or vibration acts on the electronic device, the substrate may be distorted.

DETAILED DESCRIPTION

In general, according to an embodiment, a semiconductor storage device includes a substrate having first, second, third, and fourth lateral sides and a connector interface on the first lateral side, a nonvolatile semiconductor memory disposed on a surface of the substrate between the first lateral side and the second lateral side, which is opposite to the first lateral side, a memory controller disposed on a surface of the substrate between the first lateral side and the second lateral side, and a support for the memory controller disposed on a surface of the substrate to support at least one side of the memory controller.

Hereinafter, with reference to the accompanied drawings, an electronic device and a semiconductor storage device according to embodiments will be described in detail. However, the embodiments are not presented for purpose of limitation.

For elements according to the embodiments and the explanations of these elements, a plurality of expressions may be used. For these elements and explanations, other expressions which are not used in the embodiments may be used. Furthermore, even for elements and explanations thereof for which a plurality of expressions is not used, other expressions may be used.

First Embodiment

Figure 1:
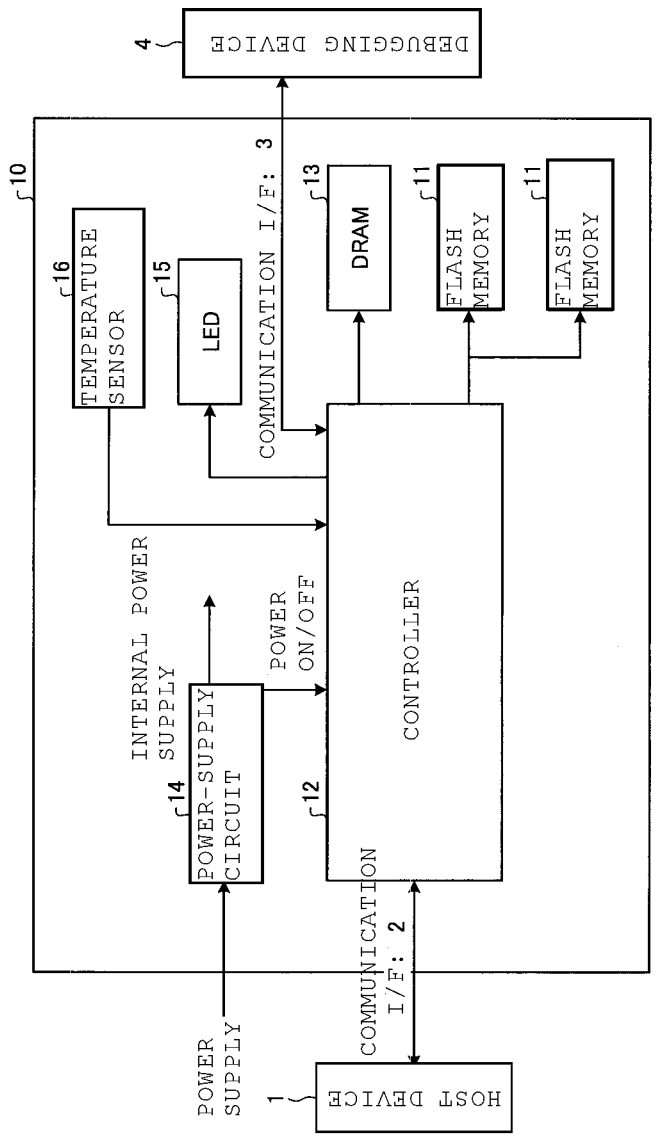
FIG. 1 is a block diagram of an SSD according to a first embodiment.

Hereinafter, a first embodiment will be described with reference to FIGS. 1 to 8. FIG. 1 is a block diagram of a solid-state drive (SSD) 10 according to the first embodiment. The SSD 10 is an example of a semiconductor storage device and can be called, for example, a memory device, an electronic device, a device, or a part of a device. Here, the semiconductor storage device is not limited to the SSD 10 and may be other devices such as a hybrid hard disk drive (hybrid HDD).

The SSD 10 is connected to a host device (hereinafter referred to as a host) 1 via a connection interface (I/F) 2. The SSD 10 is used as an auxiliary memory device of the host 1, for example. The connection interface 2 conforms to standards such as M.2, Serial Advanced Technology Attachment (SATA), mSATA, Peripheral Component Interconnect Express (PCI Express, PCIe), Universal Serial Bus (USB), and Serial Attached SCSI (SAS).

The host 1 is, for example, a CPU of a server, a personal computer, a tablet, a smartphone, or a mobile telephone or a CPU of an imaging device such as a still camera or a video camera. The host 1 is not limited to the CPU.

The SSD 10 is capable of transmitting and receiving data to and from other devices such as a debugging device 4 via a communication interface (I/F) 3 such as an RS232C interface (RS232C I/F).

The SSD 10 has a plurality of flash memories 11, a controller (memory controller) 12, a dynamic random access memory (DRAM) 13, a power-supply circuit 14, an LED 15, and a temperature sensor 16.

Each flash memory 11 is an example of a nonvolatile memory and can also be called, for example, a nonvolatile semiconductor memory element, an electronic part, a memory element, a semiconductor element, a storage unit, an element, or a part thereof. The controller 12 can also be called, for example, a drive control circuit, an electronic part, a control unit, an element, or a part thereof.

The flash memory 11 is, for example, a NAND flash memory. Here, the flash memory 11 may be any other flash memory. The DRAM 13 is an example of a volatile memory and can also be called, for example, a volatile semiconductor memory element, an electronic part, a memory element, a semiconductor element, a storage unit, an element, or a part. The DRAM 13 is capable of performing faster memory operation than the flash memory 11. The LED 15 is used to display an operational state of the SSD 10. The temperature sensor 16 detects temperature inside the SSD 10.

The controller 12 is, for example, a system on a chip (SoC). Here, the controller 12 may be any other integrated circuit (IC) or circuit, for example. The controller 12 controls the flash memories 11, the DRAM 13, the power-supply circuit 14, the LED 15, and the temperature sensor 16, for example.

The power-supply circuit 14 generates a plurality of different internal direct-current power-supply voltages from an external direct-current power which is supplied from a power-supply circuit of the host 1. The power-supply circuit 14 supplies these internal direct-current power-supply voltages to the circuits in the SSD 10. The power-supply circuit 14 detects the rising edge of the external power, generates a power-on reset signal, and supplies the power-on reset signal to the controller 12.

Figure 2:
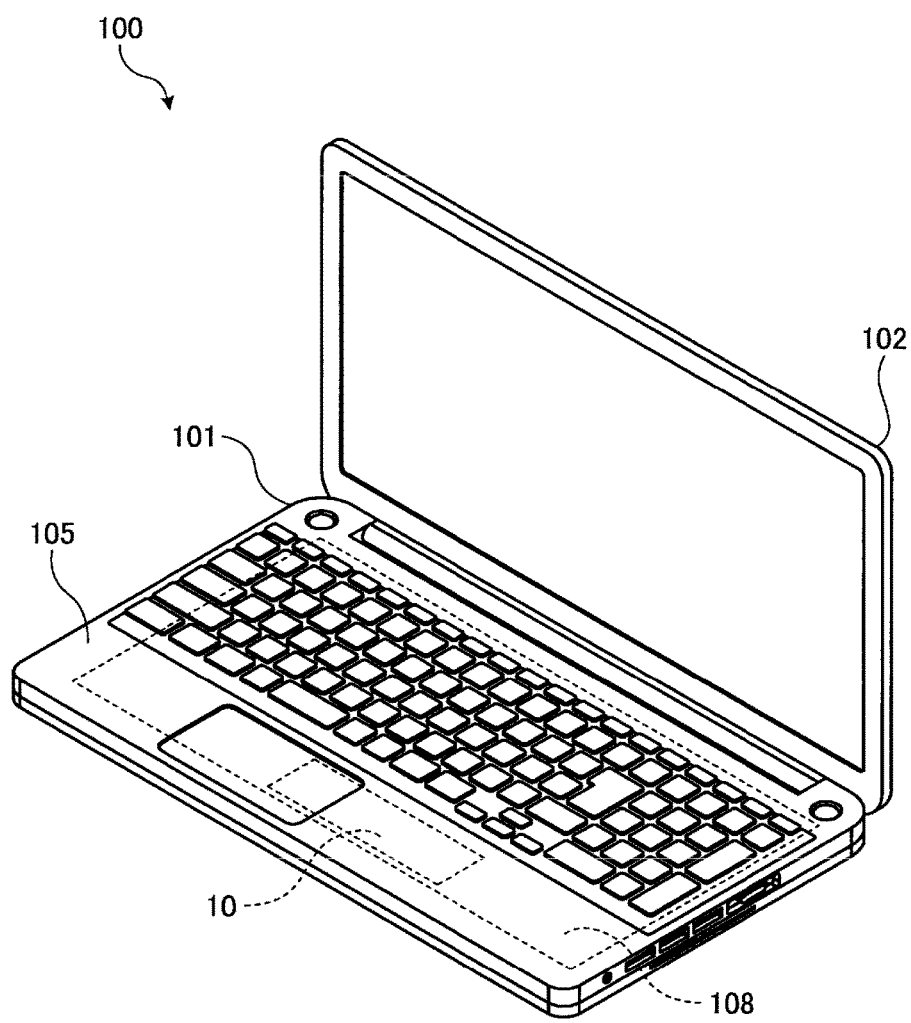
FIG. 2 is a perspective view of a portable computer according to the first embodiment.

FIG. 2 is a perspective view of a portable computer 100 according to the first embodiment. The portable computer 100 is an example of an electronic device. The electronic device may be, for example, a personal computer, a tablet, a television receiver, a smartphone, a mobile telephone, an IC recorder, a household electric appliance, or any other device.

The portable computer 100 has a main body 101 and a display 102. The main body 101 has a housing 105. The housing 105 houses various parts including the SSD 10. The display 102 is rotatably connected to the main body 101. The display 102 displays images.

The housing 105 houses a motherboard 108. The housing 105 also houses other substrates such as a daughterboard. For example, on the motherboard 108, a CPU, which is an example of the host 1, and the SSD 10 are mounted. The SSD 10 may be mounted on any other substrate, for example.

The motherboard 108 is fixed to the housing 105. For example, the motherboard 108 is attached to the housing 105 with screws. Alternatively, the motherboard 108 may be fixed to the housing 105 by other members.

Figure 3:
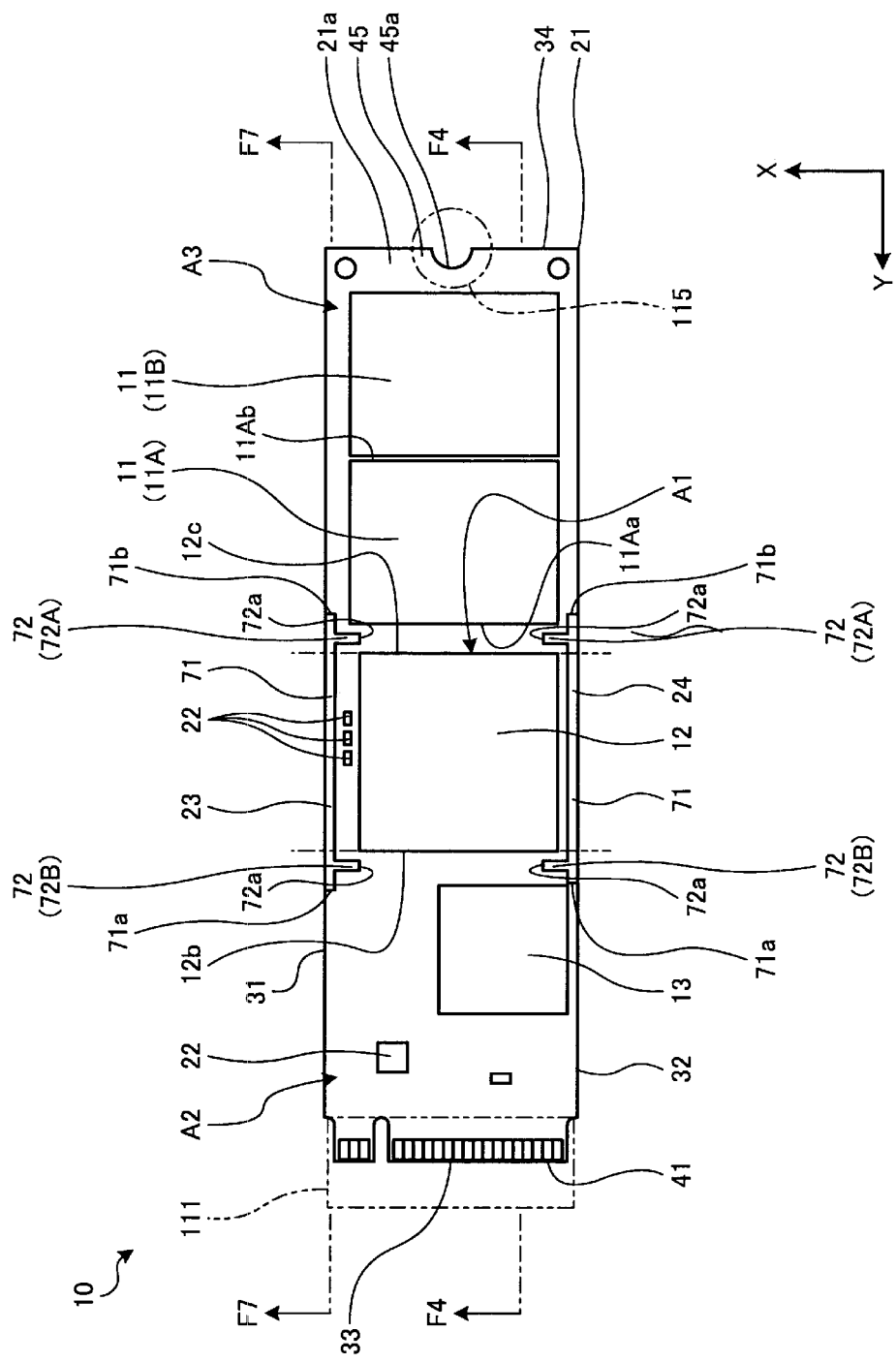
FIG. 3 is a plan view of the SSD according to the first embodiment.
Figure 4:
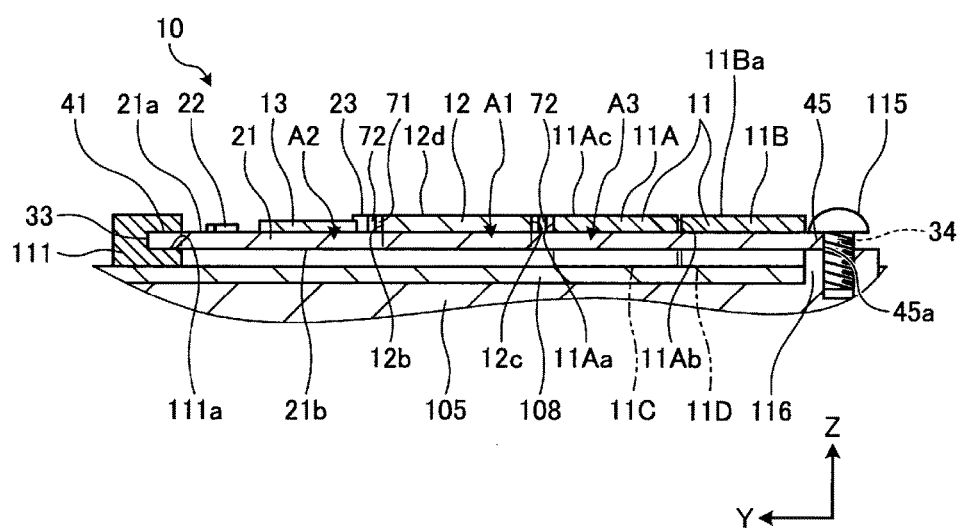
FIG. 4 is a cross-sectional view of the SSD according to the first embodiment taken along a line F4-F4 in FIG. 3.
Figure 5:
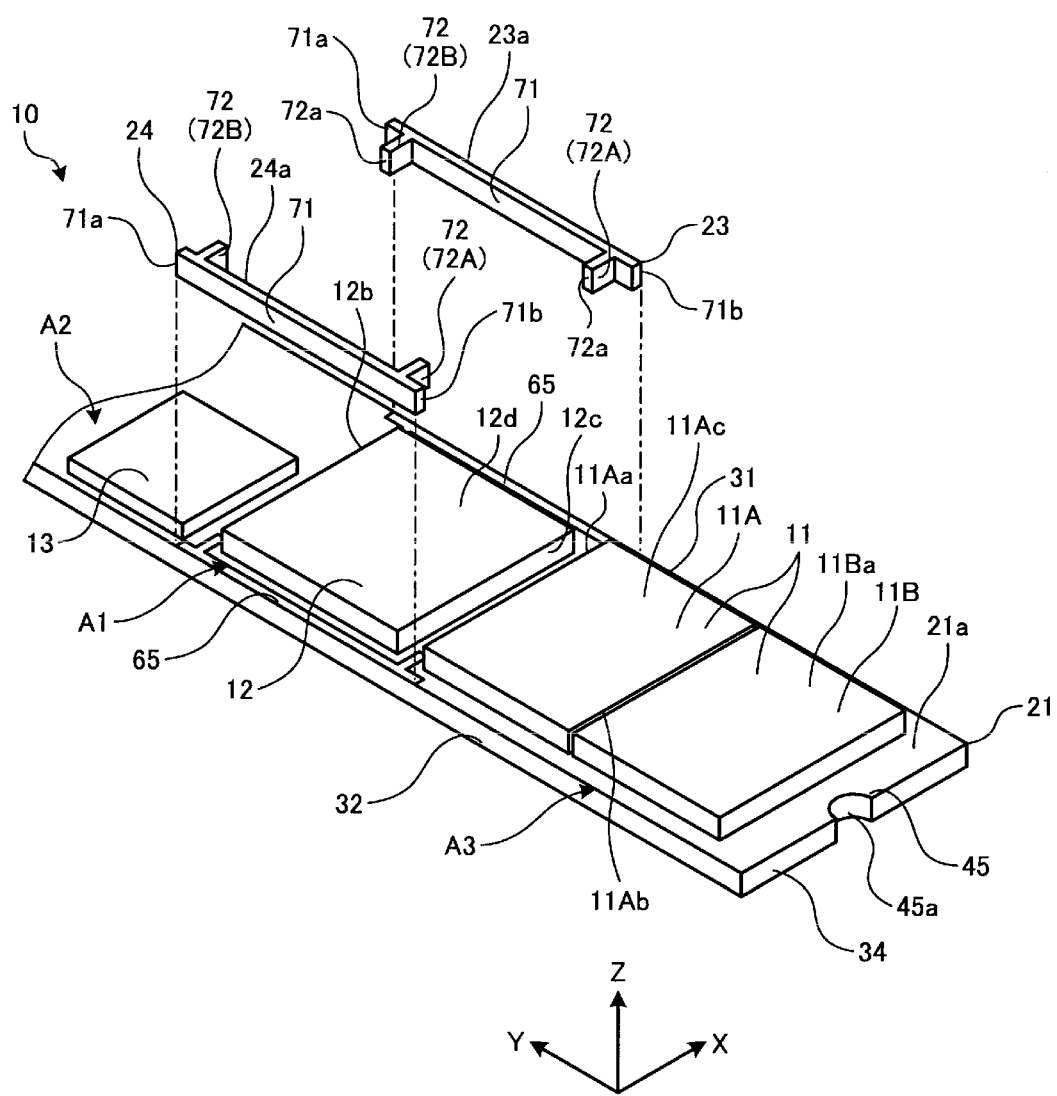
FIG. 5 is a perspective view of a part of the SSD according to the first embodiment.

FIG. 3 is a plan view of the SSD 10 according to the first embodiment. FIG. 4 is a cross-sectional view of the SSD 10 according to the first embodiment taken along the line F4-F4 in FIG. 3. FIG. 5 is a perspective view of a part of the SSD 10 according to the first embodiment. As depicted in these drawings, in the present disclosure, X axis, Y axis, and Z axis are defined. X axis, Y axis, and Z axis intersect at right angles. X axis extends along a width direction (lateral direction) of the SSD 10. Y axis extends along a length direction (longitudinal direction) of the SSD 10. Z axis extends along a thickness direction of the SSD 10.

As depicted in FIG. 3, the SSD 10 has a substrate 21, a plurality of electronic parts 22, a first support bar (first support member) 23, and a second support bar (second support member) 24. The substrate 21 is an example of a substrate and can also be called, for example, a wiring board or a member. The first support bar 23 is an example of a first member and a first extension member. The second support bar 24 is an example of a third member and a second extension member. The SSD 10 may have only one of the first support bar 23 and the second support bar 24.

The SSD 10 is a relatively small-sized memory device such as a so-called chewing gum package-type SSD, and an example of the external dimensions thereof is 22 mm×80 mm. However, the size of the SSD 10 is not limited to the size described above, and the embodiment can be appropriately applied to SSDs of various sizes. Moreover, the SSD 10 may be an SSD which is different from the chewing gum package-type SSD, such as a 2.5-inch SSD further having a case that houses the substrate 21.

The substrate 21 is a printed circuit board (PCB). The substrate 21 may be any other substrate. The substrate 21 is formed of a virtually quadrangular plate extending in a direction along Y axis. The direction along Y axis is an example of a first direction and includes a positive direction along Y axis (a direction indicated by an arrow on Y axis) and a negative direction along Y axis (a direction opposite to the direction indicated by the arrow on Y axis). The substrate 21 may be formed in any other form.

As depicted in FIG. 4, the substrate 21 has a first surface 21a and a second surface 21b. The first surface 21a is a substantially flat surface facing in a positive direction along Z axis (a direction indicated by an arrow on Z axis). The positive direction along Z axis is an example of a third direction. The second surface 21b is a substantially flat surface facing in a negative direction along Z axis (a direction opposite to the direction indicated by the arrow on Z axis). The first and second surfaces 21a and 21b may be curved surfaces or may have projections and depressions, for example. The second surface 21b is located on the side opposite to the first surface 21a.

As depicted in FIG. 3, the substrate 21 further has a first end 31, a second end 32, a third end 33, and a fourth end 34. The first end 31 is an example of a first end and a first edge. The second end 32 is an example of a second end and a second edge. The third end 33 is an example of a third end and a third edge. The fourth end 34 is an example of a fourth end and a fourth edge.

The first end 31 is one end of the substrate 21 in a direction along X axis. The direction along X axis is an example of a second direction and includes a positive direction along X axis (a direction indicated by an arrow on X axis) and a negative direction along X axis (a direction opposite to the direction indicated by the arrow on X axis). X axis extends along the first surface 21a. The second end 32 is the other end of the substrate 21 in the direction along X axis. The second end 32 is located on the side opposite to the first end 31. In other words, the second end 32 is apart from the first end 31 in the direction along X axis. The first end 31 and the second end 32 extend in the direction along Y axis.

The third end 33 is one end of the substrate 21 in the direction along Y axis. The fourth end 34 is the other end of the substrate 21 in the direction along Y axis. The fourth end 34 is located on the side opposite to the third end 33. The fourth end 34 is apart from the third end 33 in the direction along Y axis. The distance between the third end 33 and the fourth end 34 is longer than the distance between the first end 31 and the second end 32. The third end 33 and the fourth end 34 extend in the direction along X axis.

On the first surface 21a of the substrate 21, the plurality of flash memories 11, the controller 12, and the DRAM 13 are mounted. At least one of the flash memories 11, the controller 12, and the DRAM 13 may be mounted on the second surface 21b. For example, as depicted in FIG. 4, the flash memories 11 may be mounted on the first surface 21a and the other flash memories 11 indicated by chain double-dashed lines may be mounted on the second surface 21b.

The two flash memories 11 mounted on the first surface 21a include a flash memory 11A and a flash memory 11B. The flash memory 11A is an example of a first nonvolatile memory. The flash memory 11B is an example of a second nonvolatile memory.

The flash memories 11 indicated by the chain double-dashed lines and mounted on the second surface 21b include a flash memory 11C and a flash memory 11D. The flash memory 11C is an example of a third semiconductor memory. The flash memory 11D is an example of a fourth semiconductor memory.

The controller 12 is located in the virtually central part of the substrate 21 in the direction along Y axis. In other words, part of the controller 12 is located in the center between the third end 33 and the fourth end 34 in the direction along Y axis. The controller 12 may be placed in any other location.

As depicted in FIG. 3, in the direction along X axis, the distance between the controller 12 and the first end 31 is longer than the distance between the controller 12 and the second end 32. In the direction along X axis, the distance between the controller 12 and the first end 31 may be shorter than the distance between the controller 12 and the second end 32. Furthermore, in the direction along X axis, the distance between the controller 12 and the first end 31 and the distance between the controller 12 and the second end 32 may be equal to each other.

In the direction along Y axis, the plurality of flash memories 11 is located between the controller 12 and the fourth end 34. The plurality of flash memories 11 is arranged in the direction along Y axis. In the direction along Y axis, the DRAM 13 is located between the controller 12 and the third end 33. The plurality of flash memories 11, the controller 12, and the DRAM 13 may be located in any other locations.

Some electronic parts 22 are located between the controller 12 and the first end 31. The electronic parts 22 may be located between the controller 12 and the second end 32. The electronic parts 22 may be located in any other locations.

At the third end 33 of the substrate 21, a first connector (connector interface) 41 is provided. The first connector 41 is an example of a connector. The first connector 41 is provided along the third end 33. In other words, in the direction along Y axis, the first connector 41 is provided between the third end 33 and the DRAM 13. The first connector 41 is an example of a first fixing portion. The first connector 41 has a plurality of electrodes provided along the third end 33, for example.

As depicted in FIG. 4, a second connector 111 is mounted on the motherboard 108. The second connector 111 is an example of an external device. A slot 111a is provided in the second connector 111. The slot 111a has an opening in the negative direction along Y axis and extends in the direction along X axis.

The first connector 41 can be inserted into the slot 111a of the second connector 111 and connected to the second connector 111. In that case, the controller 12 of the SSD 10 is electrically connected to the host 1 mounted on the motherboard 108 via the first connector 41 and the second connector 111.

As a result of the first connector 41 being inserted into the slot 111a of the second connector 111, the first connector 41 is fixed to the motherboard 108. In other words, the first connector 41 is fixed to the housing 105 via the motherboard 108. As described above, the first connector 41 may be indirectly fixed to the housing 105.

The above-described power-supply circuit 14 is provided on the first face 21a or the second face 21b of the substrate 21. The power-supply circuit 14 may be provided in the substrate 21. The power-supply circuit 14 generates an internal voltage based on a power supplied from the external motherboard 108 via the first connector 41. The power-supply circuit 14 supplies the generated internal voltage to the plurality of flash memories 11, the controller 12, the DRAM 13, and the other parts.

Near the fourth end 34 of the substrate 21, a screw fixation portion (fixing portion) 45 is provided. The screw fixation portion 45 is an example of a second fixing portion. The screw fixation portion 45 is apart from the first connector 41 in the direction along Y axis. A notch 45a is provided in the screw fixation portion 45. The notch 45a is formed in the form of a semicircle, for example, from the fourth end 34 toward the inside of the substrate 21.

A screw 115 is fit into the notch 45a. The screw 115 is threaded into a boss 116 of the housing 105 and secured thereto, for example. The screw 115 limits the movement of the screw fixation portion 45 of the substrate 21. As a result, the screw fixation portion 45 is fixed to the housing 105. The screw fixation portion 45 may be indirectly fixed to the housing 105.

As described above, each of the first connector 41 and the screw fixation portion 45 of the substrate 21 is fixed to the housing 105. In other words, each of the first connector 41 and the screw fixation portion 45 of the substrate 21 is directly or indirectly fixed to the housing 105. The distance between the first connector 41 and the screw fixation portion 45 in the direction along Y axis is longer than the distance between the first end 31 and the second end 32 in the direction along X axis.

Figure 6:
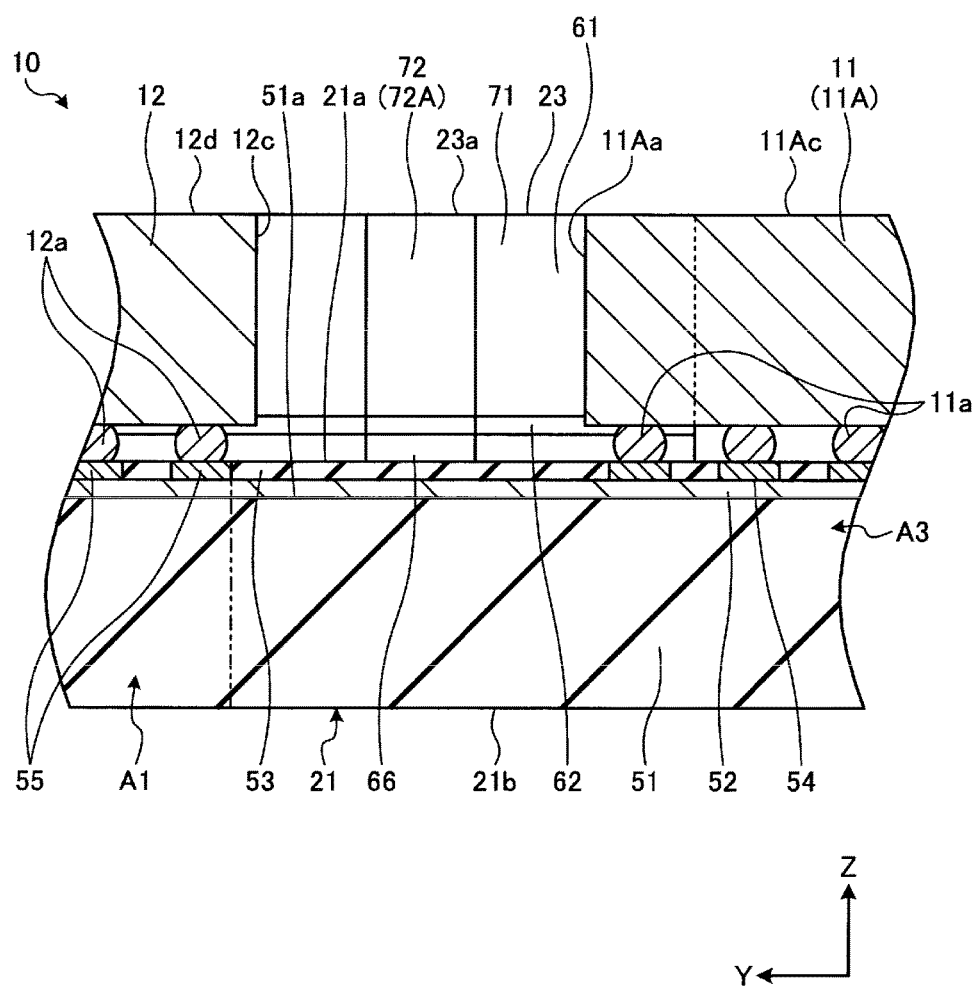
FIG. 6 is an enlarged cross-sectional view of a part of the SSD according to the first embodiment taken along the line F4-F4 in FIG. 3.

FIG. 6 is an enlarged cross-sectional view of a part of the SSD 10 according to the first embodiment taken along the line F4-F4 in FIG. 3. As depicted in FIG. 6, the substrate 21 has a base material 51, a conductive layer 52, an insulating layer 53, a plurality of first pads 54, and a plurality of second pads 55.

The base material 51 is an insulating substrate made of a glass cloth impregnated with synthetic resin, for example. The conductive layer 52 is formed on a surface 51a of the base material 51. The conductive layer 52 is made of an electric conductor such as copper and forms various patterns such as a wiring pattern, a ground pattern, and a power-supply pattern.

The insulating layer 53 covers at least part of the conductive layer 52. The plurality of first pads 54 and the plurality of second pads 55 are made of an electric conductor such as nickel or copper and are provided on the conductive layer 52. The plurality of first and second pads 54 and 55 are exposed in holes formed in the insulating layer 53, for example. The insulating layer 53 and the first and second pads 54 and 55 form the first surface 21a of the substrate 21. In other words, the first and second pads 54 and 55 are present in the first surface 21a.

The plurality of first pads 54 are arranged in the direction along X axis and the direction along Y axis. Also, the plurality of second pads 55 is arranged in the direction along X axis and the direction along Y axis. In other words, the first and second pads 54 and 55 are arranged in a matrix. The arrangement of the first and second pads 54 and 55 is not limited to the arrangement described above.

The flash memories 11 each have a plurality of first terminals 11a. The first terminals 11a are solder balls, for example. Each of the plurality of first terminals 11a is electrically connected to a corresponding first pad 54.

The controller 12 has a plurality of second terminals 12a. The second terminals 12a are solder balls, for example. Each of the plurality of second terminals 12a is electrically connected to a corresponding second pad 55.

As depicted in FIG. 3, the substrate 21 has a first region A1, a second region A2, and a third region A3. The first to third regions A1 to A3 are arranged in the direction along Y axis. The first to third regions A1 to A3 are divided by chain double-dashed lines.

The first region A1 is an example of a first portion, which is part of a first substrate in the first direction, the first portion on which a controller is mounted. The second region A2 is an example of a third portion, which is part of the first substrate in the first direction and is located between the controller and the first fixing portion. The third region A3 is an example of a fourth portion, which is part of the first substrate in the first direction and is located between the controller and the second fixing portion. These third and fourth portions are included in a second portion, which is part of the first substrate in the first direction and is off the controller. That is, each of the second region A2 and the third region A3 is also an example of the second portion.

The first region A1 is part of the substrate 21 in the direction along Y axis and the controller 12 is mounted thereon. Specifically, as depicted in FIG. 6, in the direction along Y axis, part of the substrate 21 located between the second pads 55 at the edge in the negative direction along Y axis and the second pads 55 at the edge in the positive direction along Y axis is the first region A1 in the present embodiment.

As depicted in FIG. 3, the second region A2 is part of the substrate 21 in the direction along Y axis and is located between the controller 12 and the first connector 41. The second region A2 is off the connector 12 in the direction along Y axis.

The third region A3 is part of the substrate 21 in the direction along Y axis and is located between the controller 12 and the screw fixation portion 45. The third region A3 is off the connector 12 in the direction along Y axis. Between the second region A2 and the third region A3, the first region A1 is located.

Here, the placement of the plurality of flash memories 11, the controller 12, and the DRAM 13 will be described in detail. The controller 12 is located between the two flash memories 11 and the DRAM 13 in the direction along Y axis.

The flash memory 11A is closer to the controller 12 than the flash memory 11B in the direction along Y axis. The flash memory 11A is provided on the side opposite to the connector 41 when viewed from the position of the controller 12 in the direction along Y axis. Then, the flash memory 11B is provided on the side opposite to the controller 12 when viewed from the position of the flash memory 11A in the direction along Y axis.

The flash memory 11A has one end 11Aa and the other end 11Ab in the direction along Y axis. The end 11Aa is an example of a seventh end. The end 11Ab is an example of an eighth end.

The one end 11Aa of the flash memory 11A faces in the positive direction along Y axis and extends in the direction along X axis. The end 11Aa is opposite to the controller 12. The other end 11Ab of the flash memory 11A faces in the negative direction along Y axis and extends in the direction along X axis. The end 11Ab is opposite to the flash memory 11B.

The controller 12 has one end 12b and the other end 12c in the direction along Y axis. The end 12b is an example of a fifth edge. The end 12c is an example of a sixth edge.

The one end 12b of the controller 12 faces in the positive direction along Y axis and extends in the direction along X axis. The end 12b faces in the direction of the third end 33 of the substrate 21. The other end 12c of the controller 12 faces in the negative direction along Y axis and extends in the direction along X axis. The end 12c faces in the direction of the fourth end 34 of the substrate 21.

The flash memory 11C is provided in such a way that the flash memory 11C and the flash memory 11A are symmetric with respect to the substrate 21, for example. At least part of the flash memory 11C overlaps with the flash memory 11A when the first surface 21a of the substrate 21 is viewed in a plan view.

The flash memory 11D is provided in such a way that the flash memory 11D and the flash memory 11B are symmetric with respect to the substrate 21, for example. At least part of the flash memory 11D overlaps with the flash memory 11B when the first surface 21a of the substrate 21 is viewed in a plan view. However, the flash memories 11C and 11D may be provided in other locations.

In the direction along Y axis, the DRAM 13 is provided on the same side as the first connector 41 when viewed from the position of the controller 12. The DRAM 13 is apart from the controller 12 and the first connector 41 in the direction along Y axis.

Figure 7:
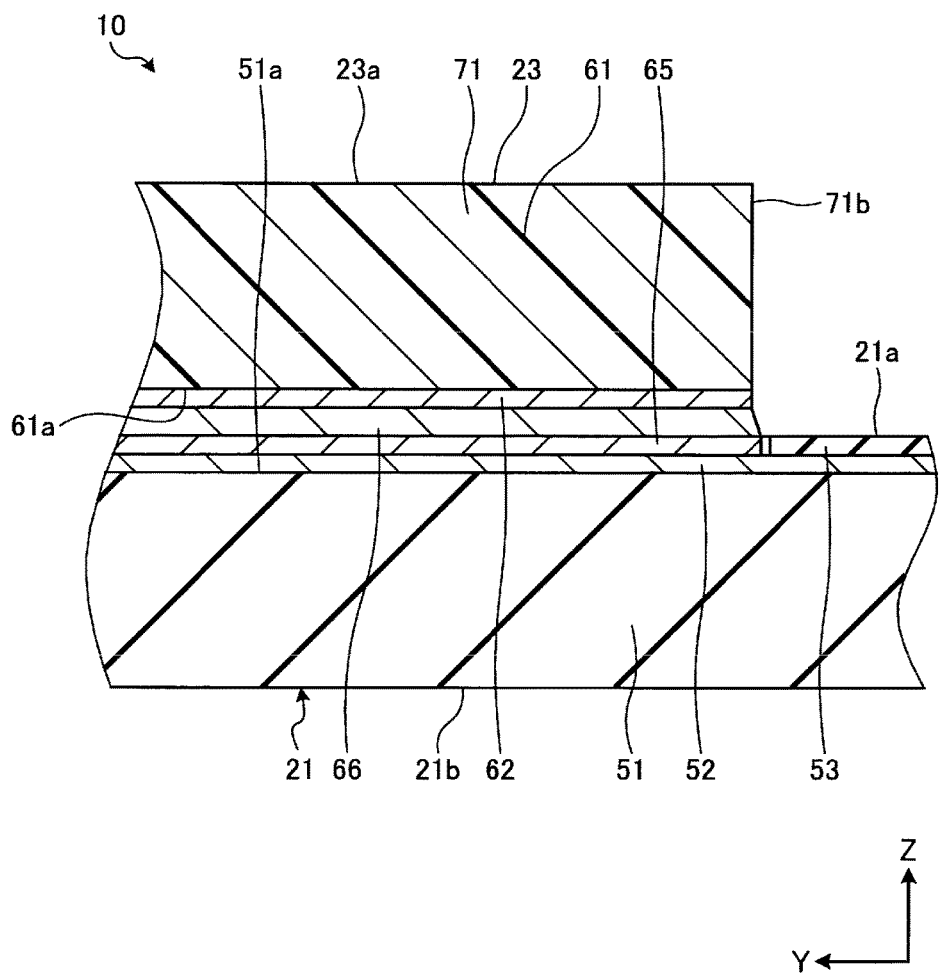
FIG. 7 is a cross-sectional view of a part of the SSD according to the first embodiment taken along a line F7-F7 in FIG. 3.

FIG. 7 is a cross-sectional view of a part of the SSD 10 according to the first embodiment taken along the line F7-F7 of FIG. 3. As depicted in FIG. 7, the first support bar 23 has a supporting portion 61 and a metal portion 62. The metal portion 62 is an example of a first electric conductor.

The supporting portion 61 is made of resin, for example. The resin includes synthetic resin and natural resin. The supporting portion 61 may be made of any other material such as ceramic or metal. The supporting portion 61 has a bottom surface 61a. The bottom surface 61a faces in the direction of the first surface 21a of the substrate 21.

The metal portion 62 covers the bottom surface 61a. The metal portion 62 is formed on the bottom surface 61a by plating, for example. As a result, the thermal conductivity of the supporting portion 61 is lower than the thermal conductivity of the metal portion 62. However, the thermal conductivity of the supporting portion 61 and the thermal conductivity of the metal portion 62 are not limited to those described above.

On the substrate 21, a conductor pattern 65 is provided. The conductor pattern 65 is an example of a second electric conductor. The conductor pattern 65 is made of an electric conductor such as nickel or copper and is provided on the ground pattern of the conductive layer 52. Alternatively, the conductor pattern 65 may be independent of the conductive layer 52. The conductor pattern 65 is exposed in a hole provided in the insulating layer 53, for example. As a result, the conductor pattern 65 is present in the first surface 21a of the substrate 21.

The metal portion 62 of the first support bar 23 is attached to the conductor pattern 65 via solder 66. In other words, the metal portion 62 is soldered to the conductor pattern 65. As a result, the first support bar 23 is mounted on the first surface 21a of the substrate 21.

The second support bar 24 also has a supporting portion 61 and a metal portion 62 and is attached to the conductor pattern 65 via the solder 66. As a result, the second support bar 24 is mounted on the first surface 21a of the substrate 21. Alternatively, the second support bar 24 may be mounted on the second surface 21b.

The metal portions 62 of the first and second support bars 23 and 24 may be soldered to the ground pattern of the conductive layer 52 or a pattern independent of other wiring. In this case, the ground pattern of the conductive layer 52 or the pattern independent of other wiring is an example of the second electric conductor.

As depicted in FIG. 5, the conductor pattern 65 extends in the direction along Y axis over the first region A1 and the second region A2. Furthermore, the conductor pattern 65 extends in the direction along Y axis over the first region A1 and the third region A3. In other words, part of the conductor pattern 65 is located in the first region A1. Another part of the conductor pattern 65 is located in the second region A2. Still another part of the conductor pattern 65 is located in the third region A3. The part of the conductor pattern 65 located in the first region A1, the part of the conductor pattern 65 located in the second region A2, and the part of the conductor pattern 65 located in the third region A3 may be apart from one another.

As depicted in FIG. 3, the first support bar 23 has a first extending portion 71 and two second extending portions 72. In the present embodiment, the first extending portion 71 of the first support bar 23 is an example of a first extending portion and a first extension portion. In the present embodiment, the two second extending portions 72 of the first support bar 23 are examples of a second extending portion, a first protruding portion, and a second protruding portion. The first extending portion 71 and the second extending portions 72 are integrally formed. The first extending portion 71 and the second extending portions 72 may be formed separately.

The first extending portion 71 extends in the direction along Y axis. However, the direction in which the first extending portion 71 extends may be a direction diagonally intersecting the direction along Y axis as long as the direction is a direction from part of the first connector 41 to part of the screw fixation portion 45.

The first extending portion 71 extends in the direction along Y axis over the first region A1 and the second region A2. In other words, the first extending portion 71 extends in the direction along Y axis across the boundary between the first region A1 and the second region A2. Part of the first extending portion 71 is located in the first region A1. Furthermore, another part of the first extending portion 71 is located in the second region A2.

In addition, the first extending portion 71 extends in the direction along Y axis over the first region A1 and the third region A3. In other words, the first extending portion 71 extends in the direction along Y axis across the boundary between the first region A1 and the third region A3. Part of the first extending portion 71 is located in the first region A1. Furthermore, another part of the first extending portion 71 is located in the third region A3.

The first extending portion 71 and the conductor pattern 65 to which the first extending portion 71 is attached extend in the direction along Y axis in abutting contact with the first end 31 of the substrate 21. As a result, part of the first extending portion 71 is located between the controller 12 and the first end 31. Furthermore, some electronic parts 22 are located between the controller 12 and the first extending portion 71. Here, the first extending portion 71 may be apart from the first end 31.

The first extending portion 71 extends in the direction along Y axis over part of the substrate 21 in the direction along Y axis, the part on which one flash memory 11 is mounted, and part of the substrate 21 in the direction along Y axis, the part which is off the flash memory 11. In other words, the first extending portion 71 extends in the direction along Y axis across the boundary between the part of the substrate 21 in the direction along Y axis, the part on which the flash memory 11 is mounted, and the part of the substrate 21 in the direction along Y axis, the part which is off the flash memory 11.

To describe the first extending portion 71 using another expression, the first extending portion 71 has one end 71a and the other end 71b in the direction along Y axis. The end 71a is an example of a fifth end. The end 71b is an example of a sixth end.

The one end 71a of the first extending portion 71 is closer to the first connector 41 than the controller 12 in the direction along Y axis. The end 71a is located between the controller 12 and the first connector 41 in the direction along Y axis.

The other end 71b of the first extending portion 71 is closer to the flash memory 11A than the controller 12 in the direction along Y axis. The end 71b is farther away from the first connector 41 than the one end 11Aa of the flash memory 11A in the direction along Y axis. Furthermore, the end 71b is closer to the first connector 41 than the other end 11Ab of the flash memory 11A in the direction along Y axis. In other words, the end 71b is located between the one end 11Aa and the other end 11Ab of the flash memory 11A in the direction along Y axis.

The two second extending portions 72 extend from the first extending portion 71 in the negative direction along X axis. In other words, the second extending portions 72 extend toward the second end 32. The second extending portions 72 may extend in a direction diagonally intersecting X axis. Furthermore, the direction in which one second extending portion 72 extends and the direction in which the other second extending portion 72 extends may be different from each other.

The two second extending portions 72 include one second extending portion 72A and the other second extending portion 72B. The second extending portion 72A is an example of the first protruding portion. The second extending portion 72B is an example of the second protruding portion.

The second extending portion 72B is located in the second region A2. The second extending portion 72B is located between the controller 12 and the DRAM 13 in the direction along Y axis. The second extending portion 72A is located in the third region A3. The second extending portion 72A is located between the controller 12 and the flash memory 11A in the direction along Y axis. In the direction along Y axis, the controller 12 is located between the two second extending portions 72A and 72B.

The second extending portions 72 each have a tip 72a. The tip 72a is an example of a fifteenth end and an eleventh edge. The tip 72a is an end of the ends of each second extending portion 72 in the direction along X axis, the end apart from the first extending portion 71. In other words, the tip 72a is located on the side opposite to the first extending portion 71 in the direction along X axis.

In the direction along X axis, the tip 72a is closer to the first end 31 of the substrate 21 than the center of the controller 12 in the direction along X axis. The center of the controller 12 in the direction along X axis is the center between one end and the other end of the controller 12 in the direction along X axis.

Each of the first extending portion 71 and the two second extending portions 72 has the supporting portion 61 and the metal portion 62. As a result, the metal portions 62 are located on the supporting portion 61 of the first extending portion 71 and on the supporting portions 61 of the second extending portions 72 and are attached to the conductor pattern 65 via the solder 66. Then, the thermal conductivity of the supporting portion 61 of the first extending portion 71 and the thermal conductivity of the supporting portions 61 of the second extending portions 72 are lower than the thermal conductivity of the metal portions 62.

As depicted in FIG. 6, in the direction along Z axis, the length (thickness) of the first support bar 23 is roughly equal to the length (thickness) of the controller 12. Furthermore, in the direction along Z axis, the length of the first support bar 23 is roughly equal to the length (thickness) of the flash memory 11.

In the direction along Z axis, the length of the first support bar 23 is greater than the length (thickness) of each of the plurality of electronic parts 22. Here, the plurality of electronic parts 22 may include an electronic part 22 of which length in the direction along Z axis is greater than the length of the first support bar 23.

Here, the placement of the plurality of flash memories 11, the controller 12, and the first support bar 23 in the direction along Z axis will be described in detail. The flash memory 11A has an upper surface 11Ac. The upper surface 11Ac is an example of a twelfth end. The upper surface 11Ac is an end of the ends of the flash memory 11A in the direction along Z axis, the end apart from the first surface 21a of the substrate 21.

The flash memory 11B has an upper surface 11Ba. The upper surface 11Ba is an example of a thirteenth end. The upper surface 11Ba is an end of the ends of the flash memory 11B in the direction along Z axis, the end apart from the first surface 21a of the substrate 21.

The controller 12 has an upper surface 12d. The upper surface 12d is an example of a fourteenth end. The upper surface 12d is an end of the controller 12 in the direction along Z axis, apart from the first surface 21a of the substrate 21.

The first support bar 23 has an upper surface 23a. The upper surface 23a is an example of an eleventh end. The upper surface 23a is an end of the first support bar 23 in the direction along Z axis, apart from the first surface 21a of the substrate 21.

In the direction along Z axis, the distance between the first surface 21a of the substrate 21 and the upper surface 23a of the first support bar 23 is greater than the distance between the first surface 21a and the upper surface 11Ac of the flash memory 11A. Furthermore, in the direction along Z axis, the distance between the first surface 21a and the upper surface 23a of the first support bar 23 is greater than the distance between the first surface 21a and the upper surface 11Ba of the flash memory 11B. In addition, in the direction along Z axis, the distance between the first surface 21a and the upper surface 23a of the first support bar 23 is greater than the distance between the first surface 21a and the upper surface 12d of the controller 12.

As depicted in FIG. 3, the second support bar 24 also has a first extending portion 71 and two second extending portions 72. The first extending portion 71 of the second support bar 24 is an example of a second extension portion. The two second extending portions 72 of the second support bar 24 are examples of a third protruding portion and a fourth protruding portion.

The first extending portion 71 of the second support bar 24 also extends in the direction along Y axis. Here, the direction in which the first extending portion 71 of the second support bar 24 extends and the direction in which the first extending portion 71 of the first support bar 23 extends may be different from each other.

The first extending portion 71 of the second support bar 24 also extends in the direction along Y axis over the first region A1 and the second region A2 of the substrate 21. Furthermore, the first extending portion 71 extends in the direction along Y axis over the first region A1 and the third region A3 of the substrate 21.

The first extending portion 71 of the second support bar 24 and the conductor pattern 65 to which the first extending portion 71 is attached extend in the direction along Y axis in abutting contact with the second end 32 of the substrate 21. As a result, part of the second support bar 24 is located between the controller 12 and the second end 32. Here, the second support bar 24 may be apart from the second end 32.

To describe the first extending portion 71 of the second support bar 24 using another expression, the first extending portion 71 of the second support bar 24 also has one end 71a and the other end 71b in the direction along Y axis. The one end 71a of the first extending portion 71 of the second support bar 24 is an example of a ninth end. The other end 71b of the first extending portion 71 of the second support bar 24 is an example of a tenth end.

The one end 71a of the first extending portion 71 is closer to the first connector 41 than the controller 12 in the direction along Y axis. The end 71a is located between the controller 12 and the first connector 41 in the direction along Y axis.

The other end 71b of the first extending portion 71 is closer to the flash memory 11A than the controller 12 in the direction along Y axis. The end 71b is farther away from the first connector 41 than the one end 11Aa of the flash memory 11A in the direction along Y axis. Furthermore, the end 71b is closer to the first connector 41 than the other end 11Ab of the flash memory 11A in the direction along Y axis. In other words, the end 71b is located between the one end 11Aa and the other end 11Ab of the flash memory 11A in the direction along Y axis.

The two second extending portions 72 of the second support bar 24 extend from the first extending portion 71 in the positive direction along X axis. In other words, the two second extending portions 72 of the second support bar 24 extend toward the first end 31.

The two second extending portions 72 of the second support bar 24 also include one second extending portion 72A and the other second extending portion 72B. The second extending portion 72A is an example of the third protruding portion. The second extending portion 72B is an example of the fourth protruding portion.

The second extending portion 72B is located in the second region A2. The second extending portion 72B is located between the controller 12 and the DRAM 13 in the direction along Y axis. The second extending portion 72A is located in the third region A3. The second extending portion 72A is located between the controller 12 and the flash memory 11A in the direction along Y axis. In the direction along Y axis, the controller 12 is located between the two second extending portions 72A and 72B.

Each of the second extending portions 72 of the second support bar 24 also has a tip 72a. In the direction along X axis, the tips 72a of the second support bar 24 are closer to the second end 32 of the substrate 21 than the center of the controller 12 in the direction along X axis.

In the direction along Z axis, the length (thickness) of the second support bar 24 is roughly equal to the length of the controller 12. Furthermore, in the direction along Z axis, the length of the second support bar 24 is roughly equal to the length (thickness) of the flash memory 11.

In the direction along Z axis, the length of the second support bar 24 is greater than the length of each of the plurality of electronic parts 22. Here, the plurality of electronic parts 22 may include an electronic part 22 of which length in the direction along Z axis is greater than the length of the second support bar 24.

The second support bar 24 has an upper surface 24a. The upper surface 24a is an end of the second support bar 24 in the direction along Z axis, apart from the first surface 21a of the substrate 21.

In the direction along Z axis, the distance between the first surface 21a of the substrate 21 and the upper surface 24a of the second support bar 24 is greater than the distance between the first surface 21a and the upper surface 11Ac of the flash memory 11A. Furthermore, in the direction along Z axis, the distance between the first surface 21a and the upper surface 24a of the second support bar 24 is greater than the distance between the first surface 21a and the upper surface 11Ba of the flash memory 11B. In addition, in the direction along Z axis, the distance between the first surface 21a and the upper surface 24a of the second support bar 24 is greater than the distance between the first surface 21a and the upper surface 12d of the controller 12.

The second extending portions 72 of the second support bar 24 extend in the direction along X axis over a part of the substrate 21 in the direction along X axis, the part on which the controller 12 is mounted, and a part of the substrate 21 in the direction along X axis, the part which is off the controller 12. In other words, the second extending portions 72 extend in the direction along X axis across the boundary between the part of the substrate 21 in the direction along X axis, the part on which the controller 12 is mounted, and the part of the substrate 21 in the direction along X axis, the part which is off the controller 12. The second extending portions 72 of the first support bar 23 may extend in the direction along X axis over the part of the substrate 21 in the direction along X axis, the part on which the controller 12 is mounted, and the part of the substrate 21 in the direction along X axis, the part which is off the controller 12.

The first and second support bars 23 and 24 do not cover the controller 12. In other words, each of the first support bar 23 and the second support bar 24 allows the controller 12 to be exposed.

Figure 8:
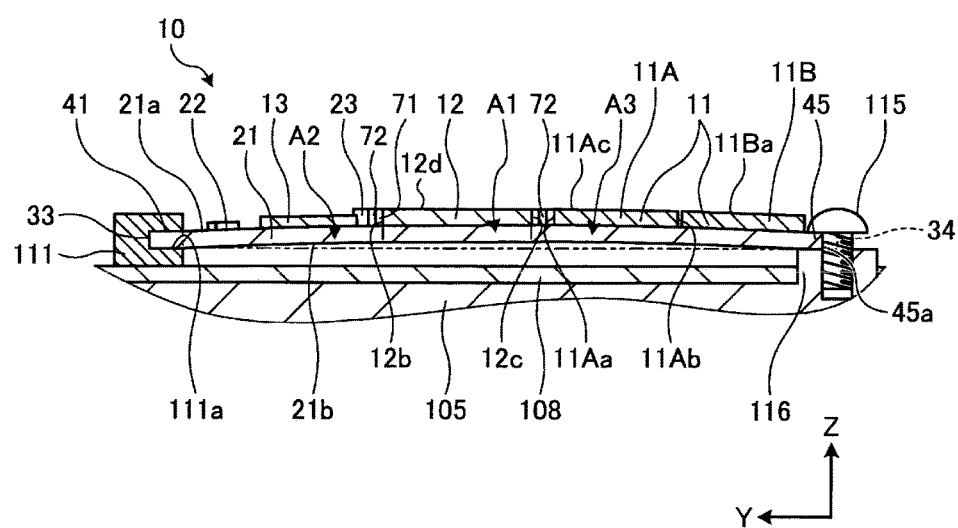
FIG. 8 is a cross-sectional view of the vibrating SSD according to the first embodiment that is in a distorted state.

FIG. 8 is a cross-sectional view of the SSD 10 of the first embodiment that is distorted. For the purpose of illustration, FIG. 8 depicts the SSD 10 bent upward in FIG. 8 and the SSD 10 bent downward is omitted in FIG. 8. An impact or vibration sometimes acts on the portable computer 100 from the outside, for instance.

As described above, the substrate 21 of the SSD 10 is fixed to the housing 105 at the first connector 41 and the screw fixation portion 45. As a result, for example, when an impact or vibration acts on the portable computer 100, a part of the SSD 10 between the first connector 41 and the screw fixation portion 45 sometimes vibrates.

A solid line of FIG. 8 indicates the SSD 10 distorted upward. A chain double-dashed line of FIG. 8 indicates the SSD 10 without distortion. As depicted in FIG. 8, the substrate 21 of the SSD 10 is bent in such a way as to protrude in the positive direction or the negative direction along Z axis.

In FIG. 8, the SSD 10 is distorted according to a first-order deformation. As a result, the greatest amount of distortion of the SSD 10 in the direction along Z axis is observed in a virtually central part of the substrate 21 in the direction along Y axis. The SSD 10 may be distorted according to other orders such as a second-order distortion.

The elastic modulus in bending of the parts of the substrate 21 on which the first support bar 23 and the second support bar 24 are mounted is higher than the elastic modulus in bending of the other parts of the substrate 21. As a result, the parts of the substrate 21 on which the first support bar 23 and the second support bar 24 are mounted are prevented from being deformed compared to the other parts of the substrate 21.

In general, when the part of the substrate 21 between the first connector 41 and the screw fixation portion 45 vibrates, stress tends to concentrate on a connection between the second pads 55 at the edge in the negative direction along Y axis and the second terminals 12a of the controller 12. Moreover, stress concentration tends to occur at a connection between the second pads 55 at the edge in the positive direction along Y axis and the second terminals 12a of the controller 12.

However, in the present embodiment, the first extending portions 71 of the first support bar 23 and the second support bar 24 prevent deformation of the part of the substrate 21 in which the second pads 55 at the edge in the negative direction along Y axis are present. As a result, stress is less likely to concentrate on the connection between the second pads 55 at the edge in the negative direction along Y axis and the second terminals 12a of the controller 12.

Specifically, the elastic modulus in bending of the parts of the substrate 21 on which the first support bar 23 and the second support bar 24 are mounted gets closer to the elastic modulus in bending of the controller 12. As a result, a difference between the amount of deformation of the substrate 21 and the amount of deformation of the controller 12 becomes smaller, whereby stress is less likely to concentrate on the connection between the second pads 55 and the second terminals 12a of the controller 12.

Furthermore, the first extending portions 71 of the first support bar 23 and the second support bar 24 prevent bending of the part of the substrate 21 in which the second pads 55 at the edge in the positive direction along Y axis are present. As a result, stress is less likely to concentrate on the connection between the second pads 55 at the edge in the positive direction along Y axis and the second terminals 12a of the controller 12.

In the portable computer 100 according to the first embodiment, the substrate 21 has the first connector 41 and the screw fixation portion 45 apart from the first connector 41 in the direction along Y axis. As a result, when an impact or vibration acts on the portable computer 100, the part of the substrate 21 between the first connector 41 and the screw fixation portion 45 sometimes vibrates against the housing 105. However, in the present embodiment, the first support bar 23 is mounted on the first surface 21a. The first extending portion 71 of the first support bar 23 extends in the direction along Y axis over the first region A1 which is part of the substrate 21 in the direction along Y axis, the part on which the controller 12 is mounted, and the second and third regions A2 and A3 which are parts of the substrate 21 in the direction along Y axis, the parts which are off the controller 12. The first extending portion 71 increases the bending elasticity at the boundary between the first region A1 and the second and third regions A2 and A3 of the substrate 21. As a result, even when the substrate 21 vibrates, stress concentration is less likely to occur at a part where the second terminals 12a of the controller 12 which are adjacent to the edge of the controller 12 in the direction along Y axis and the second pads 55 of the substrate 21 are connected, whereby a part where the controller 12 and the substrate 21 are connected is less likely to be damaged.

In general, by filling a space between the controller 12 and the substrate 21 with underfill, a difference between the amount of deformation of the substrate 21 and the amount of deformation of the controller 12 may be reduced. However, compared to the underfill, the first support bar 23 of the present embodiment can reduce the number of production processes of the portable computer 100. Furthermore, in the present embodiment, the controller 12 can be detached from the substrate 21, which facilitates repair of the controller 12.

The first extending portion 71 extends over the first region A1 and the second region A2, which is part of the substrate 21 in the direction along Y axis, the part between the controller 12 and the first connector 41. In addition, the first extending portion 71 extends over the first region A1 and the third region A3, which is part of the substrate 21 in the direction along Y axis, the part between the controller 12 and the screw fixation portion 45. As a result, even when the substrate 21 deforms, stress concentration is less likely to occur at a part where the second terminals 12a of the controller 12 which are adjacent to both edges of the controller 12 in the direction along Y axis and the second pads 55 of the substrate 21 are connected.

In the direction along X axis, the distance between the controller 12 and the first end 31 is longer than the distance between the controller 12 and the second end 32. Between the controller 12 and the first end 31, part of the first extending portion 71 is located. As described above, since the first support bar 23 is mounted in a relatively wide part, the first support bar 23 would not limit the mounting space of the electronic parts 22 on the substrate 21.

The second extending portions 72 extend from the first extending portion 71 in the direction along X axis intersecting the direction along Y axis. As a result, the bending elasticity of the substrate 21 in the direction along X axis is increased, whereby a part where the controller 12 and the substrate 21 are connected is less likely to be damaged by a distortion of the substrate 21, for example.

The second support bar 24 extends in the direction along Y axis over the first region A1 and the second and third regions A2 and A3. Part of the second support bar 24 is located between the controller 12 and the second end 32. On the other hand, part of the first extending portion 71 of the first support bar 23 is located between the controller 12 and the first end 31. That is, the controller 12 is located between the first support bar 23 and the second support bar 24. As a result, the first and second support bars 23 and 24 further increase the bending elasticity at the boundary between the first region A1 and the second and third regions A2 and A3 of the substrate 21, which prevents a part where the controller 12 and the substrate 21 are connected from being damaged.

The first support bar 23 is attached to the conductor pattern 65 of the substrate 21 via the solder 66. The controller 12 and the flash memories 11 are also attached to the substrate 21 via the first and second terminals 11a and 12a which are solder balls. As a result, the first support bar 23 can be mounted on the substrate 21 in a process in which the controller 12 and the flash memories 11 are mounted on the substrate 21. For instance, the first support bar 23 is mounted on the substrate 21 by a mounter as in the case of the controller 12 and the flash memories 11. Therefore, the number of production processes of the portable computer 100 can be reduced, whereby the production cost of the portable computer 100 can be reduced.

The first support bar 23 has the metal portion 62 which is present on the supporting portion 61 of the first extending portion 71 and is soldered to the conductor pattern 65. The thermal conductivity of the supporting portion 61 of the first extending portion 71 is lower than the thermal conductivity of the metal portion 62. As a result, the heat generated from the controller 12 is less likely to be released into the housing 105 through the first extending portion 71. For example, the flash memories 11 are less likely to be heated by the heat of the controller 12.

In the direction along Z axis, the length of the first support bar 23 is greater than the length of the electronic part 22. An object which gets closer to the first surface 21a is more likely to hit the first support bar 23 than the electronic parts 22, which prevents the electronic parts 22 from being damaged.

In the direction along Z axis, the length of the first support bar 23 is roughly equal to the length of the controller 12. In the direction along Z axis, the length of the first support bar 23 may be greater than the length of the controller 12, which prevents the controller 12 from being damaged.

The distance between the first connector 41 and the screw fixation portion 45 is longer than the distance between the first end 31 and the second end 32. A part of the substrate 21 between the first connector 41 and the screw fixation portion 45 tends to vibrate. However, even when the substrate 21 vibrates, the first extending portion 71 prevents stress concentration at a part where the second terminals 12a of the controller 12 which are adjacent to the edge of the controller 12 in the direction along Y axis and the second pads 55 of the substrate 21 are connected. That is, as a result of the first support bar 23 being mounted on the above-described substrate 21, a part where the controller 12 and the substrate 21 are connected is effectively prevented from being damaged.

Second Embodiment

Hereinafter, a second embodiment will be described with reference to FIG. 9. In description of the following embodiments, elements having functions similar to the functions of the elements which have already been described are described with the same characters and explanations thereof may be omitted. Moreover, the plurality of elements described with the same characters is not necessarily the same in all the functions and properties and may have different functions and properties in accordance with each embodiment.

Figure 9:
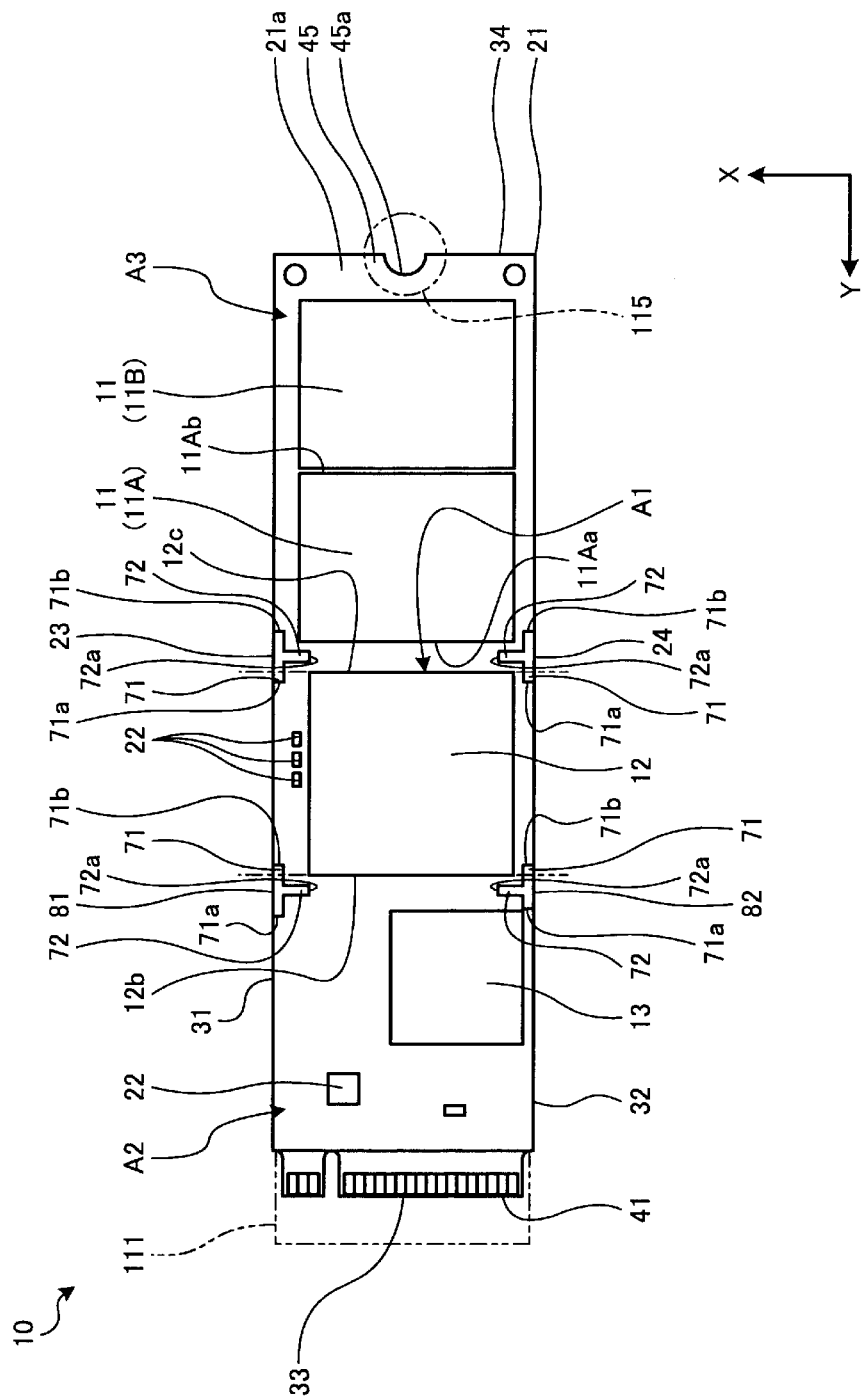
FIG. 9 is a plan view of an SSD according to a second embodiment.

FIG. 9 is a plan view of an SSD 10 according to the second embodiment. As depicted in FIG. 9, a first support bar 23 of the second embodiment has a first extending portion 71 and one second extending portion 72. The first support bar 23 may have a plurality of second extending portions 72. The first support bar 23 of the second embodiment is an example of a second member. The first extending portion 71 of the first support bar 23 is an example of a second part. The second extending portion 72 of the first support bar 23 is an example of the second protruding portion.

The first extending portion 71 extends in the direction along Y axis over the first region A1 and the third region A3. In the direction along Y axis, one end 71a of the first extending portion 71 of the first support bar 23 is located in the first region A1. The other end 71b of the first extending portion 71 is located in the third region A3. That is, the first extending portion 71 of the second embodiment is shorter than the first extending portion 71 of the first embodiment.

The first extending portion 71 of the first support bar 23 will be described using another expression. In the first support bar 23 of the second embodiment, the one end 71a of the first extending portion 71 is an example of a tenth edge. The other end 71b of the first extending portion 71 of the second embodiment is an example of a ninth edge.

The one end 71a of the first extending portion 71 is closer to the first connector 41 than the end 12c of the controller 12 in the direction along Y axis. The end 71a is located between the one end 12b and the other end 12c of the controller 12 in the direction along Y axis. In the direction along the Y axis, the end 71a is closer to the end 12c of the controller 12 than the center between the one end 12b and the other end 12c of the controller 12 in the direction along Y axis.

The other end 71b of the first extending portion 71 is closer to the flash memory 11A than the controller 12 in the direction along Y axis. The end 71b is farther apart from the first connector 41 than the one end 11Aa of the flash memory 11A in the direction along Y axis. Furthermore, the end 71b is closer to the first connector 41 than the other end 11Ab of the flash memory 11A in the direction along Y axis. In other words, the end 71b is located between the one end 11Aa and the other end 11Ab of the flash memory 11A in the direction along Y axis.

The second extending portion 72 of the first support bar 23 extends from the first extending portion 71 in the negative direction along X axis. The second extending portion 72 is located in the third region A3. The second extending portion 72 is located between the controller 12 and the flash memory 11A in the direction along Y axis. In the direction along X axis, the tip 72a of the second extending portion 72 is closer to the first end 31 of the substrate 21 than the center of the controller 12 in the direction along X axis.

As is the case with the first support bar 23, a second support bar 24 of the second embodiment has a first extending portion 71 and one second extending portion 72. The first extending portion 71 extends in the direction along Y axis over the first region A1 and the third region A3. In the direction along Y axis, one end 71a of the first extending portion 71 of the second support bar 24 is located in the first region A1. The other end 71b of the first extending portion 71 is located in the third region A3.

The one end 71a of the first extending portion 71 of the second support bar 24 is closer to the first connector 41 than the end 12c of the controller 12 in the direction along Y axis. In the direction along Y axis, the end 71a is closer to the end 12c of the controller 12 than the center between the one end 12b and the other end 12c of the controller 12 in the direction along Y axis. The other end 71b of the first extending portion 71 is closer to the flash memory 11A than the controller 12 in the direction along Y axis.

The second extending portion 72 of the second support bar 24 extends from the first extending portion 71 in the positive direction along X axis. The second extending portion 72 is located between the controller 12 and the flash memory 11A in the direction along Y axis. In the direction along X axis, the tip 72a of the second extending portion 72 is closer to the second end 32 of the substrate 21 than the center of the controller 12 in the direction along X axis.

The SSD 10 of the second embodiment further has a third support bar (third support member) 81 and a fourth support bar (fourth support member) 82. The third support bar 81 is an example of the second member. The fourth support bar 82 is an example of the third member.

The third support bar 81 and the fourth support bar 82 are mounted on the first surface 21a of the substrate 21. At least one of the third support bar 81 and the fourth support bar 82 may be mounted on the second surface 21b.

As is the case with the first support bar 23, the third support bar 81 has a first extending portion 71 and a second extending portion 72. The first extending portion 71 of the third support bar 81 is an example of a first part. The second extending portion 72 of the third support bar 81 is an example of the first protruding portion.

The first extending portion 71 of the third support bar 81 also extends in the direction along Y axis. Here, the direction in which the first extending portion 71 of the third support bar 81 extends and the direction in which the first extending portion 71 of the first support bar 23 extends may be different from each other.

The first extending portion 71 of the third support bar 81 extends in the direction along Y axis over the first region A1 and the second region A2 of the substrate 21. In the direction along Y axis, one end 71a of the first extending portion 71 of the third support bar 81 is located in the second region A2. The other end 71b of the first extending portion 71 is located in the first region A1. In the direction along Y axis, the third support bar 81 is apart from the first support bar 23.

The first extending portion 71 of the third support bar 81 and the conductor pattern 65 to which the first extending portion 71 is attached extend in the direction along Y axis in contact with the first end 31 of the substrate 21. As a result, part of the third support bar 81 is located between the controller 12 and the first end 31. Incidentally, the third support bar 81 may be apart from the first end 31.

The first extending portion 71 of the third support bar 81 will be described using another expression. In the third support bar 81, one end 71a of the first extending portion 71 is an example of a seventh edge. The other end 71b of the first extending portion 71 is an example of an eighth edge.

The one end 71a of the first extending portion 71 is closer to the first connector 41 than the controller 12 in the direction along Y axis. The end 71a is located between the controller 12 and the first connector 41 in the direction along Y axis.

The other end 71b of the first extending portion 71 is closer to the flash memory 11A than the end 12b of the controller 12 in the direction along Y axis. The end 71b is located between the one end 12b and the other end 12c of the controller 12 in the direction along Y axis. In the direction along Y axis, the end 71b is closer to the end 12b of the controller 12 than the center between the one end 12b and the other end 12c of the controller 12 in the direction along Y axis.

The second extending portion 72 of the third support bar 81 extends from the first extending portion 71 in the negative direction along X axis. In other words, the second extending portion 72 of the third support bar 81 extends toward the second end 32.

The second extending portion 72 is located in the second region A2. The second extending portion 72 is located between the controller 12 and the first connector 41 in the direction along Y axis. In the third support bar 81, in the direction along X axis, the tip 72a of the second extending portion 72 is closer to the first end 31 of the substrate 21 than the center of the controller 12 in the direction along X axis.

In the direction along Z axis, the length of the third support bar 81 is greater than the length of each of the plurality of electronic parts 22. Here, the plurality of electronic parts 22 may include an electronic part 22 of which length in the direction along Z axis is greater than the length of the third support bar 81.

As is the case with the second support bar 24, the fourth support bar 82 has a first extending portion 71 and a second extending portion 72. The first extending portion 71 of the fourth support bar 82 also extends in the direction along Y axis. Here, the direction in which the first extending portion 71 of the fourth support bar 82 extends and the direction in which the first extending portion 71 of the second support bar 24 extends may be different from each other.

The first extending portion 71 of the fourth support bar 82 extends in the direction along Y axis over the first region A1 and the second region A2 of the substrate 21. In the direction along Y axis, one end 71a of the first extending portion 71 of the fourth support bar 82 is located in the second region A2. The other end 71b of the first extending portion 71 is located in the first region A1. In the direction along Y axis, the fourth support bar 82 is apart from the second support bar 24.

The first extending portion 71 of the fourth support bar 82 and the conductor pattern 65 to which the first extending portion 71 is attached extend in the direction along Y axis in contact with the second end 32 of the substrate 21. As a result, part of the fourth support bar 82 is located between the controller 12 and the second end 32. Alternatively, the fourth support bar 82 may be apart from the second end 32.

The one end 71a of the first extending portion 71 of the fourth support bar 82 is closer to the first connector 41 than the controller 12 in the direction along Y axis. The other end 71b of the first extending portion 71 is closer to the flash memory 11A than the end 12b of the controller 12 in the direction along Y axis. In the direction along Y axis, the end 71b is closer to the end 12b of the controller 12 than the center between the one end 12b and the other end 12c of the controller 12 in the direction along Y axis.

The second extending portion 72 of the fourth support bar 82 extends from the first extending portion 71 in the positive direction along X axis. In other words, the second extending portion 72 of the fourth support bar 82 extends toward the first end 31. In the fourth support bar 82, in the direction along X axis, the tip 72a of the second extending portion 72 is closer to the second end 32 of the substrate 21 than the center of the controller 12 in the direction along X axis.

In the direction along Z axis, the length of the fourth support bar 82 is greater than the length of each of the plurality of electronic parts 22. Here, the plurality of electronic parts 22 may include an electronic part 22 of which length in the direction along Z axis is greater than the length of the fourth support bar 82.

When the SSD 10 vibrates, the first extending portions 71 of the third support bar 81 and the fourth support bar 82 prevent a part of the substrate 21 where the second pads 55 at the edge in the positive direction along Y axis are present from bending, whereby stress concentration is less likely to occur at the connection between the second pads 55 at the edge in the positive direction along Y axis and the second terminals 12a of the controller 12.

Furthermore, the first extending portions 71 of the first support bar 23 and the second support bar 24 prevent a part of the substrate 21 where the second pads 55 at the edge in the negative direction along Y axis are present from bending, whereby stress concentration is less likely to occur at the connection between the second pads 55 at the edge in the negative direction along Y axis and the second terminals 12a of the controller 12.

In the portable computer 100 of the second embodiment, the third support bar 81 extends in the direction along Y axis over the first region A1 and the second region A2. On the other hand, the first extending portion 71 of the first support bar 23 extends over the first region A1 and the third region A3. As a result, even when the substrate 21 vibrates, stress concentration is less likely to occur at a part where the second terminals 12a of the controller 12 which are adjacent to both edges of the controller 12 in the direction along Y axis and the second pads 55 of the substrate 21 are connected.

Furthermore, the first extending portion 71 of the first support bar 23 is apart from the third support bar 81 in the direction along Y axis. As a result, parts such as the electronic parts 22 can be mounted on the substrate 21 between the first support bar 23 and the third support bar 81.

Third Embodiment

Figure 10:
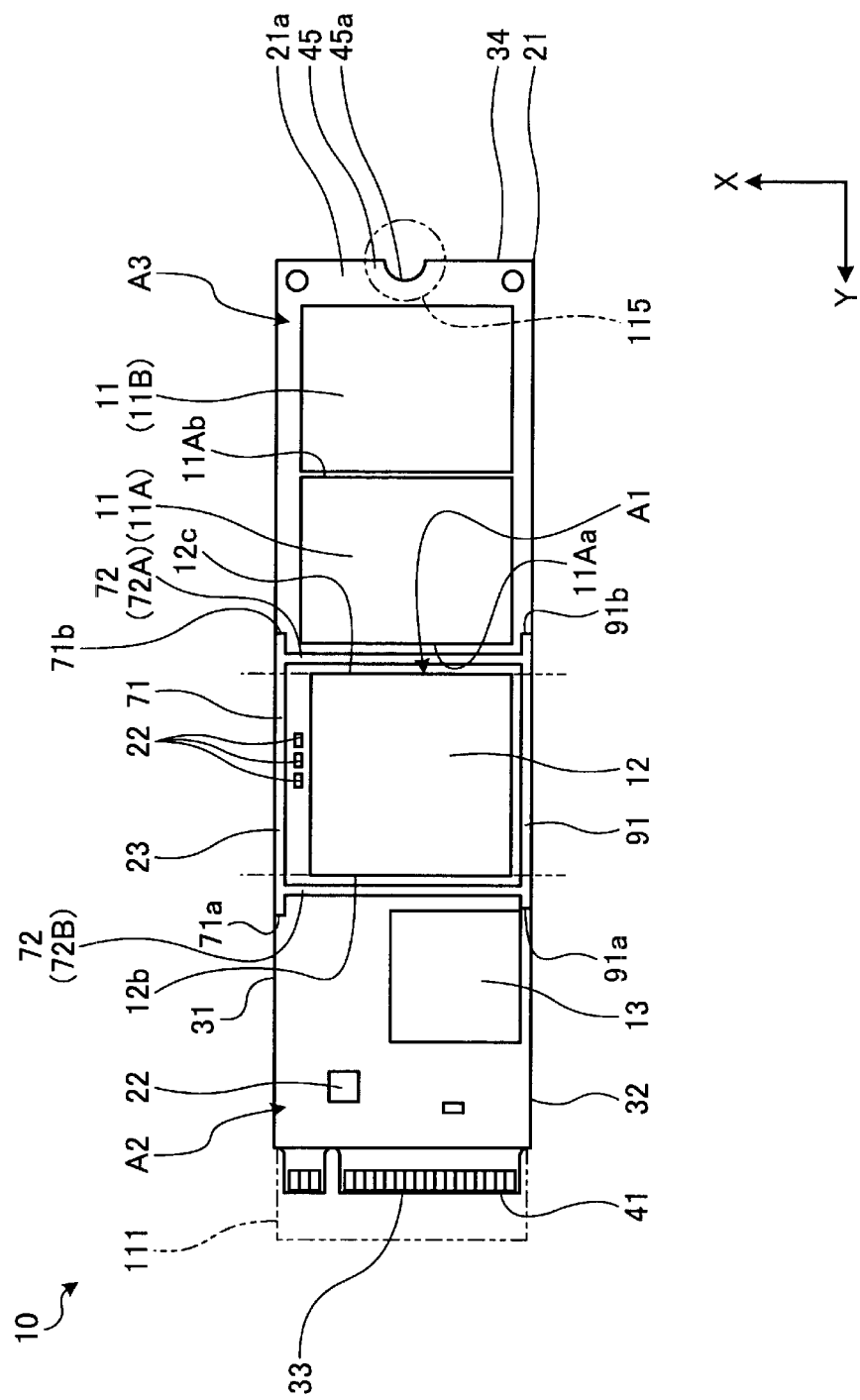
FIG. 10 is a plan view of an SSD according to a third embodiment.
Figure 11:
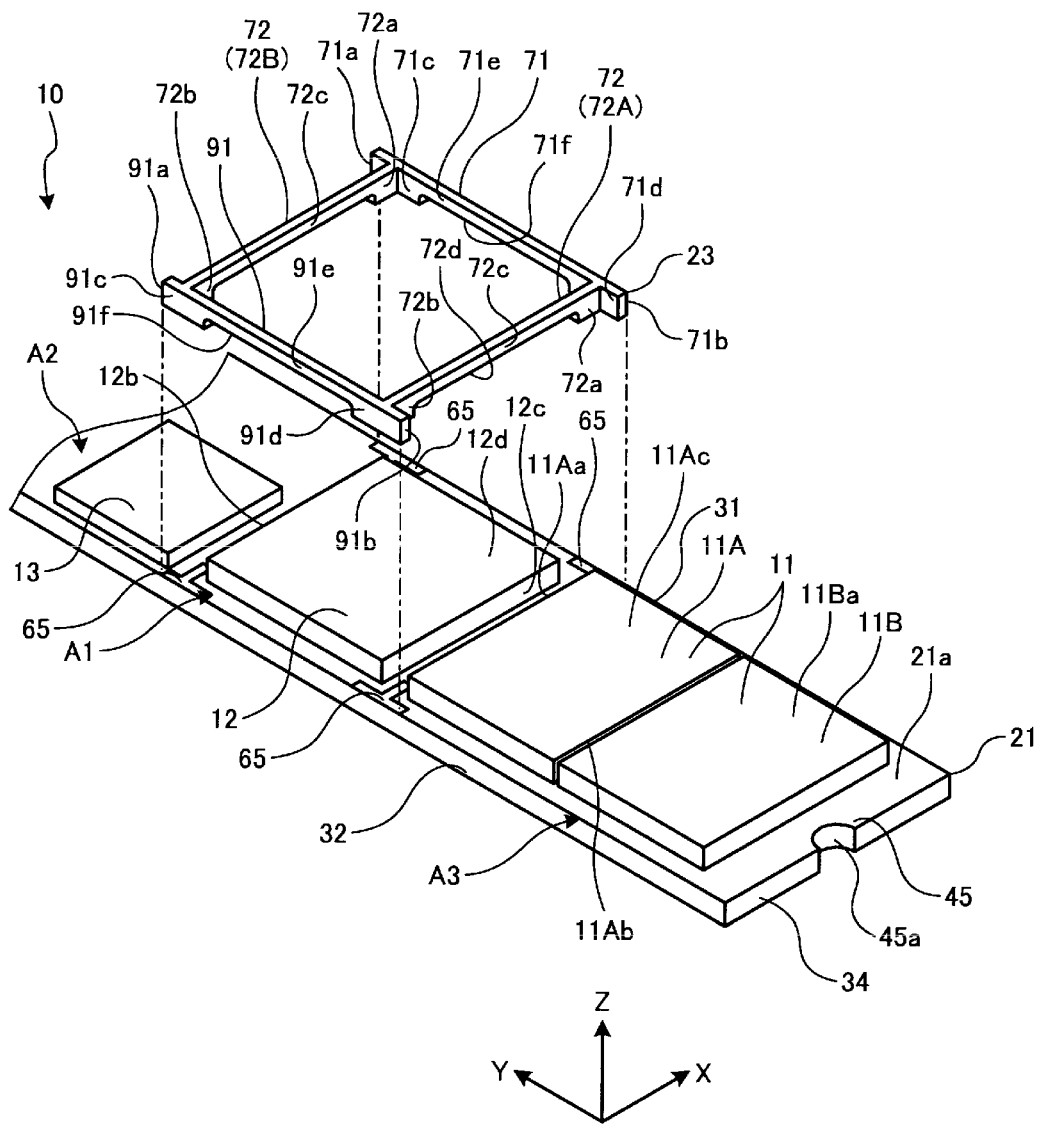
FIG. 11 is a perspective view of a part of the SSD according to the third embodiment.

Hereinafter, a third embodiment will be described with reference to FIGS. 10 and 11. FIG. 10 is a plan view of an SSD 10 according to the third embodiment. FIG. 11 is a perspective view of a part of the SSD 10 according to the third embodiment.

As depicted in FIG. 10, the SSD 10 has a first support bar 23. As is the case with the first embodiment, the first support bar (first support member) 23 of the third embodiment has a first extending portion 71 and two second extending portions 72. Furthermore, the first support bar 23 has a third extending portion 91. The third extending portion 91 is an example of a third extending portion and the second extension portion.

The third extending portion 91 extends in the direction along Y axis. Here, the direction in which the third extending portion 91 extends and the direction in which the first extending portion 71 extends may be different from each other. As in the case of the first extending portion 71, the third extending portion 91 also extends in the direction along Y axis over the first region A1 and the second region A2 of the substrate 21. Furthermore, the third extending portion 91 extends in the direction along Y axis over the first region A1 and the third region A3.

The third extending portion 91 and the conductor pattern 65 to which the third extending portion 91 is attached is in contact with the second end 32 of the substrate 21. As a result, part of the third extending portion 91 is located between the controller 12 and the second end 32. Alternatively, the third extending portion 91 may be apart from the second end 32.

To describe, the third extending portion 91 using another expression, the third extending portion 91 has one end 91a and the other end 91b in the direction along Y axis. The end 91a is an example of the ninth end. The end 91b is an example of the tenth end.

The one end 91a of the third extending portion 91 is closer to the first connector 41 than the controller 12 in the direction along Y axis. The end 91a is located between the controller 12 and the first connector 41 in the direction along Y axis.

The other end 91b of the third extending portion 91 is closer to the flash memory 11A than the controller 12 in the direction along Y axis. The end 91b is farther away from the first connector 41 than the one end 11Aa of the flash memory 11A in the direction along Y axis. Furthermore, the end 91b is closer to the first connector 41 than the other end 11Ab of the flash memory 11A in the direction along Y axis. In other words, the end 91b is located between the one end 11Aa and the other end 11Ab of the flash memory 11A in the direction along Y axis.

Each of the two second extending portions 72 connects the first extending portion 71 and the third extending portion 91. In the direction along Y axis, the controller 12 is located between one second extending portion 72 and the other second extending portion 72. The controller 12 is surrounded with the first extending portion 71, the two second extending portions 72, and the third extending portion 91 of the first support bar 23.

As depicted in FIG. 11, the first extending portion 71 has a first attachment portion 71c, a second attachment portion 71d, and an interposition portion 71e. The first attachment portion 71c has a supporting portion 61 and a metal portion 62 and is attached to a conductor pattern 65 of the substrate 21 via the solder 66. The second attachment portion 71d also has a supporting portion 61 and a metal portion 62 and is attached to a conductor pattern 65 of the substrate 21 via the solder 66. The second attachment portion 71d is apart from the first attachment portion 71c in the direction along Y axis.

The interposition portion 71e is located between the first attachment portion 71c and the second attachment portion 71d. The interposition portion 71e is apart from the first surface 21a of the substrate 21. In other words, between the first attachment portion 71c and the second attachment portion 71d, a recessed portion 71f formed in the direction away from the substrate 21 is provided.

Each of the second extending portions 72 also has a first attachment portion 72a, a second attachment portion 72b, and an interposition portion 72c. The first attachment portion 72a is attached to the conductor pattern 65 of the substrate 21 via the solder 66. The second attachment portion 72b is also attached to the conductor pattern 65 of the substrate 21 via the solder 66. The second attachment portion 72b is apart from the first attachment portion 72a in the direction along X axis.

The interposition portion 72c is located between the first attachment portion 72a and the second attachment portion 72b. The interposition portion 72c is apart from the first surface 21a of the substrate 21. In other words, between the first attachment portion 72a and the second attachment portion 72b, a recessed portion 72d formed in the direction away from the substrate 21 is provided.

The third extending portion 91 also has a first attachment portion 91c, a second attachment portion 91d, and an interposition portion 91e. The first attachment portion 91c is attached to the conductor pattern 65 of the substrate 21 via the solder 66. The second attachment portion 91d is also attached to the conductor pattern 65 of the substrate 21 via the solder 66. The second attachment portion 91d is apart from the first attachment portion 91c in the direction along Y axis.

The interposition portion 91e is located between the first attachment portion 91c and the second attachment portion 91d. The interposition portion 91e is apart from the first face 21a of the substrate 21. In other words, between the first attachment portion 91c and the second attachment portion 91d, a recessed portion 91f formed in the direction away from the substrate 21 is provided.

Between the conductor pattern 65 to which the first attachment portions 71c, 72a, and 91c are attached and the conductor pattern 65 to which the second attachment portions 71d, 72b, and 91d are attached, the insulating layer 53 is located. Incidentally, the first attachment portions 71c, 72a, and 91c and the second attachment portions 71d, 72b, and 91d may be attached to a common conductor pattern 65.

The first attachment portions 71c and 91c of the first and third extending portions 71 and 91 are attached to the conductor pattern 65 in at least the second region A2. The second attachment portions 71d and 91d of the first and third extending portions 71 and 91 are attached to the conductor pattern 65 in at least the third region A3.

When the SSD 10 vibrates, the first extending portion 71 and the third extending portion 91 prevent a part of the substrate 21 where the second pads 55 at both edges in the direction along Y axis are present from bending, whereby stress concentration is less likely to occur at a connection between the second pads 55 at both edges in the direction along Y axis and the second terminals 12a of the controller 12.

In the portable computer 100 of the third embodiment, the first support bar 23 has the third extending portion 91 of which part is located between the controller 12 and the second end 32. The second extending portion 72 connects the first extending portion 71 and the third extending portion 91. As a result, the first support bar 23 further increases the bending elasticity at the boundary between the first region A1 and the second and third regions A2 and A3 of the substrate 21, whereby a part where the controller 12 and the substrate 21 are connected is prevented from being damaged. Furthermore, the bending elasticity of the substrate 21 in the direction along X axis is increased, whereby a part where the controller 12 and the substrate 21 are connected is prevented from being damaged by a distortion of the substrate 21, for example.

Between the first attachment portions 71c, 72a, and 91c and the second attachment portions 71d, 72b, and 91d, the interposition portions 71e, 72c, and 91e apart from the substrate 21 are respectively provided. As a result, parts such as the electronic parts 22 can be mounted between the interposition portions 71e, 72c, and 91e and the substrate 21. That is, the first support bar 23 does not limit the mounting space of the electronic parts 22 on the substrate 21.

In the above-described embodiments, the first support bar 23, the second support bar 24, the third support bar 81, and the fourth support bar 82 are mounted on the substrate 21 by soldering. However, the first support bar 23, the second support bar 24, the third support bar 81, and the fourth support bar 82 may be, for example, fit into holes formed in the substrate 21 or attached to the substrate 21 by snap-fit.

According to at least one embodiment described above, the first extending portion of the first member extends in the first direction over a part of the substrate in the first direction where the controller is mounted and a part of the substrate in the first direction, the part which is off the controller. As a result, a part where the controller and the substrate are connected is prevented from being damaged.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a substrate having first, second, third, and fourth lateral sides and a connector interface on the first lateral side;
    a nonvolatile semiconductor memory disposed on a surface of the substrate between the first lateral side and the second lateral side, which is opposite to the first lateral side;
    a memory controller disposed on a surface of the substrate between the first lateral side and the second lateral side; and
    a support for the memory controller disposed on a surface of the substrate to support at least one side of the memory controller, wherein
    the memory controller and the support are disposed on a same surface of the substrate,
    the support includes a portion between the memory controller and the third lateral side that extends along an entire side surface of the memory controller,
    the support further includes a portion between the memory controller and the first lateral side that extends only partially along a side surface of the memory controller, and the support includes a first portion attached to the substrate and a second portion that is formed on the first portion and has a thermal conductivity lower than that of the first portion.

2. The semiconductor storage according to claim 1, wherein the support is attached to the substrate with a solder.

3. The semiconductor storage according to claim 2, wherein a surface of the substrate on which the support is attached has a conductive pattern.

4. The semiconductor storage according to claim 1, wherein
a thickness of the first portion is less than a thickness of the second portion.

5. The semiconductor storage according to claim 1, wherein
the memory controller is disposed over a center of the substrate in a direction extending from the first lateral side surface to the second lateral side surface.

6. A semiconductor storage device comprising:
a substrate having first, second, third, and fourth lateral sides and a connector interface on the first lateral side;
a nonvolatile semiconductor memory disposed on a surface of the substrate between the first lateral side and the second lateral side, which is opposite to the first lateral side;
a memory controller disposed on a surface of the substrate between the first lateral side and the second lateral side; and
a first support for the memory controller disposed on a surface of the substrate to support at least one side of the memory controller, wherein
the memory controller and the first support are disposed on a same surface of the substrate,
the first support includes a portion between the memory controller and the third lateral side that extends along an entire side surface of the memory controller, and
the first support further includes a portion between the memory controller and the first lateral side that extends only partially along a side surface of the memory controller; and
a second support for the memory controller disposed on a surface of the substrate to support at least one side of the memory controller, wherein
the memory controller and the second support are disposed on a same surface of the substrate,
the second support includes a portion between the memory controller and the fourth lateral side that extends along an entire side surface of the memory controller,
the second support further includes a portion between the memory controller and the first lateral side that extends only partially along a side surface of the memory controller, and
each of the first and second supports includes a first portion attached to the substrate and a second portion that is formed on the first portion and has a thermal conductivity lower than that of the first portion.

7. The semiconductor storage according to claim 6, wherein
the first and second supports are attached to the substrate with a solder.

8. The semiconductor storage according to claim 7, wherein
a surface of the substrate on which the support is attached has a conductive pattern.

9. The semiconductor storage according to claim 6, wherein
a thickness of the first portion is less than a thickness of the second portion.

10. The semiconductor storage according to claim 6, wherein
the memory controller is disposed over a center of the substrate in a direction extending from the first lateral side to the second lateral side.

* * * * *